(12) United States Patent
Landa et al.

(10) Patent No.: US 9,354,251 B2
(45) Date of Patent: May 31, 2016

(54) INTEGRATED CIRCUIT (IC) TEST SOCKET USING KELVIN BRIDGE

(71) Applicant: Titan Semiconductor Tool, LLC, Ladera Ranch, CA (US)

(72) Inventors: Victor Landa, Ladera Ranch, CA (US); Pongsak Tiengtum, Ladera Ranch, CA (US)

(73) Assignee: Titan Semiconductor Tool, LLC, Ladera Ranch, CA (US)

( * ) Notice: Subject to any disclaimer, the term of this patent is extended or adjusted under 35 U.S.C. 154(b) by 163 days.

(21) Appl. No.: 14/189,787

(22) Filed: Feb. 25, 2014

(65) Prior Publication Data

US 2015/0241474 A1    Aug. 27, 2015

(51) Int. Cl.
*G01R 1/04* (2006.01)
*G01R 31/28* (2006.01)

(52) U.S. Cl.
CPC .......... *G01R 1/0466* (2013.01); *G01R 31/2851* (2013.01)

(58) Field of Classification Search
CPC ........... G01R 31/2851; G01R 31/2853; G01R 1/0425; G01R 1/0433; G01R 1/0441; G01R 1/0466; H05K 7/1046

USPC .................... 439/55–85; 324/755.01–755.11
See application file for complete search history.

(56) References Cited

U.S. PATENT DOCUMENTS

| | | | |
|---|---|---|---|
| 6,409,521 B1 | 6/2002 | Rathburn | |
| 7,737,708 B2 | 6/2010 | Sherry | |
| 7,918,669 B1 | 4/2011 | Tiengtum | |
| 8,441,275 B1 * | 5/2013 | Alladio | G01R 1/0466 324/756.01 |
| 2012/0062261 A1 | 3/2012 | Nelson et al. | |
| 2013/0099810 A1 | 4/2013 | Erdman et al. | |

OTHER PUBLICATIONS

International Search Report dated May 29, 2015 for related PCT International Application No. PCT/US15/17380 with international filing date of Feb. 24, 2015.

* cited by examiner

*Primary Examiner* — Benjamin M Baldridge
*Assistant Examiner* — Rahul Maini
(74) *Attorney, Agent, or Firm* — Fulwider Patton LLP

(57) ABSTRACT

An integrated circuit test socket is adapted to use with Kelvin connectors by creating closely spaced connectors and counter-rotating links that are nested to conserve space. The connectors are shaped to make contact with a chip and communicate force and sense signals to a tester, allowing a measure of the chip's actual resistance.

5 Claims, 7 Drawing Sheets

INTEGRATED CIRCUIT (IC) TEST SOCKET USING KELVIN BRIDGE

BACKGROUND

The present invention relates to sockets that electrically connects an integrated circuit with an IC board. More particularly, the present invention is directed to a test socket for testing an integrated circuit, wherein the test socket uses a Kelvin bridge/connector to improve the accuracy over standard IC board testing devices.

Integrated circuit test devices have long been used in the semiconductor industry to test and evaluate the quality of the chips taken off the manufacturing line. Signal integrity is a critical aspect of chip design and testing. To this end, it is desirable to maintain impedance through a conducting portion of a contact interconnecting the integrated circuit lead to its corresponding load board pad at a particular desired level. The effective impedance of the design is a function of a number of factors. These include width and length of conduction path, material of which the conductive structure is made, material thickness, etc.

When testing the electrical characteristics of a packaged or molded semiconductor device such as an integrated circuit (IC), it is common to utilize a specialized test socket that secures and connects the IC to the equipment that evaluates its performance, i.e. a handler and a load board. Many different test sockets have been devised for quickly and temporarily connecting integrated circuit leads of a chip to be tested to a load board of a tester. Automated test apparatus in particular use a number of such sockets. Typical socket arrangements use force brought to bear upon a contact positioned between a lead of the IC and the load board to deform a probe tip of the contact and engage a pad on the load board. Such a configuration provides for positive connection between the pins or contact pads of the device under test ("DUT") and corresponding leads of a test apparatus. Examples of this type of connection can be found, for example, in U.S. Pat. No. 6,409,521 to Rathburn, and U.S. Pat. No. 7,737,708 to Sherry, the teachings and contents of both of which are fully incorporated herein by reference.

U.S. Pat. No. 7,918,669, the contents of which are incorporated herein by reference, is a test socket devised by the present inventor. The socket of the '669 patent uses a unique linkage to urge the connectors of the test circuit upward where it can make contact with the test equipment. This test socket was found to be very successful in ensuring good contact with the test apparatus while reducing force on the circuit itself. A component of that test socket was an elastomer element that provided a resiliency to the link, ensuring proper contact in a cost effective and reliable manner. The cylindrical elastomer keeps the contact links in place, and their resiliency acts like a spring mechanism for the links. This allows for vertical movement on the link.

Accuracy is critical to the testing operation, as mass produced chips require knowledge of the capabilities and limits of the chips. For that reason, ways to improve the accuracy of the testing is always under review. The present invention is a test socket that uses Kelvin connectors to improve the accuracy of the test, particularly in the low voltage environment of the IC chips.

SUMMARY OF THE INVENTION

The present invention is directed to an integrated circuit test socket that includes Kelvin connectors to form a Kelvin bridge. The Kelvin bridge is a modification of a Wheatstone bridge, and is formed with specially shaped connectors that accomplish the contacts needed to form the Kelvin bridge arrangement on the test socket. With standard contact technology, test develop engineers require evolving performance from signal delivery systems. The challenge when using Kelvin connectors is getting two contacts onto one signal pad due to the small surface area and geometry. Typical QFN packages are 0.25 mm wide×0.35 mm long, and existing spring probe technology forms contacts on the long edge, but has mechanical and electrical performance limitations. Other manufactures have attempted side by side contact, but board fabrication at the smaller pitches are not cost effective. Other cantilever designs require long signal paths, thereby higher resistance and inductance.

The present invention is able to overcome the shortcomings discussed above and is able to get a two contacts onto one pad by nesting the opposing links. By notching one side, the links counter-rotate toward each other but do not touch, a requirement in Kelvin Testing.

These and many other features of the present invention will best be understood by reference to the following descriptions and figures. However, it is to be understood that while the inventor's best mode has been described and shown, the invention is not to be limited to any particular drawing or description. Rather, it is understood that there may be many variations of the present invention that would be readily appreciated by one of ordinary skill in the art, and the invention encompasses all such variations and modifications.

DETAILED DESCRIPTION OF THE PREFERRED EMBODIMENTS

Figure 1:
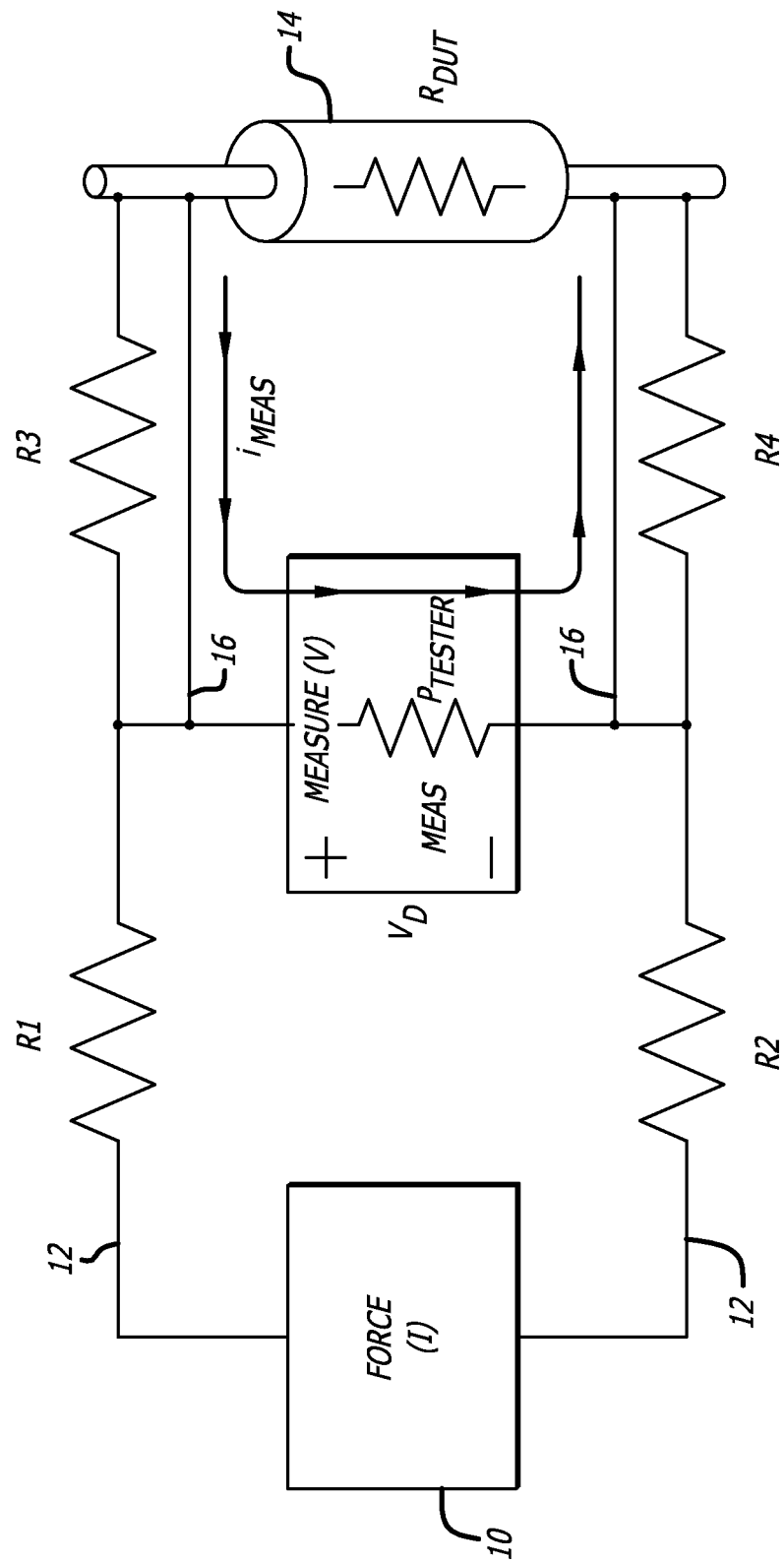
FIG. 1 is a schematic diagram of a Kelvin bridge.

Four-terminal sensing, also known as Kelvin sensing, after William Thomson, Lord Kelvin, is used to measure very low resistance. A two wire connection is referred to as a Kelvin connection, and a pair of contacts that is designed to connect a force-and-sense pair to a single terminal or lead simultaneously is called a "Kelvin contact." FIG. 1 is an illustration of simplified circuit diagram wherein current is supplied by a driving force 10 at two wires 12 through a pair of resistors R1, R2, to measure the resistance $R_{DUT}$ of the device under test 14. A bridge is formed by R3 and R4, and a wire 16 is connected to the device under test 14 to measure the voltage across the tester. The resistance of the tester is determined by measuring the voltage drop $V_D$. The current also creates a voltage drop in the path to the device 14, and to avoid this voltage in the measurement a separate pair of wires are connected directly to the device 14. Ideally, the impedance will be high so that there is negligible current on the sensing path and a negligible voltage drop across the sense path.

Figure 2:
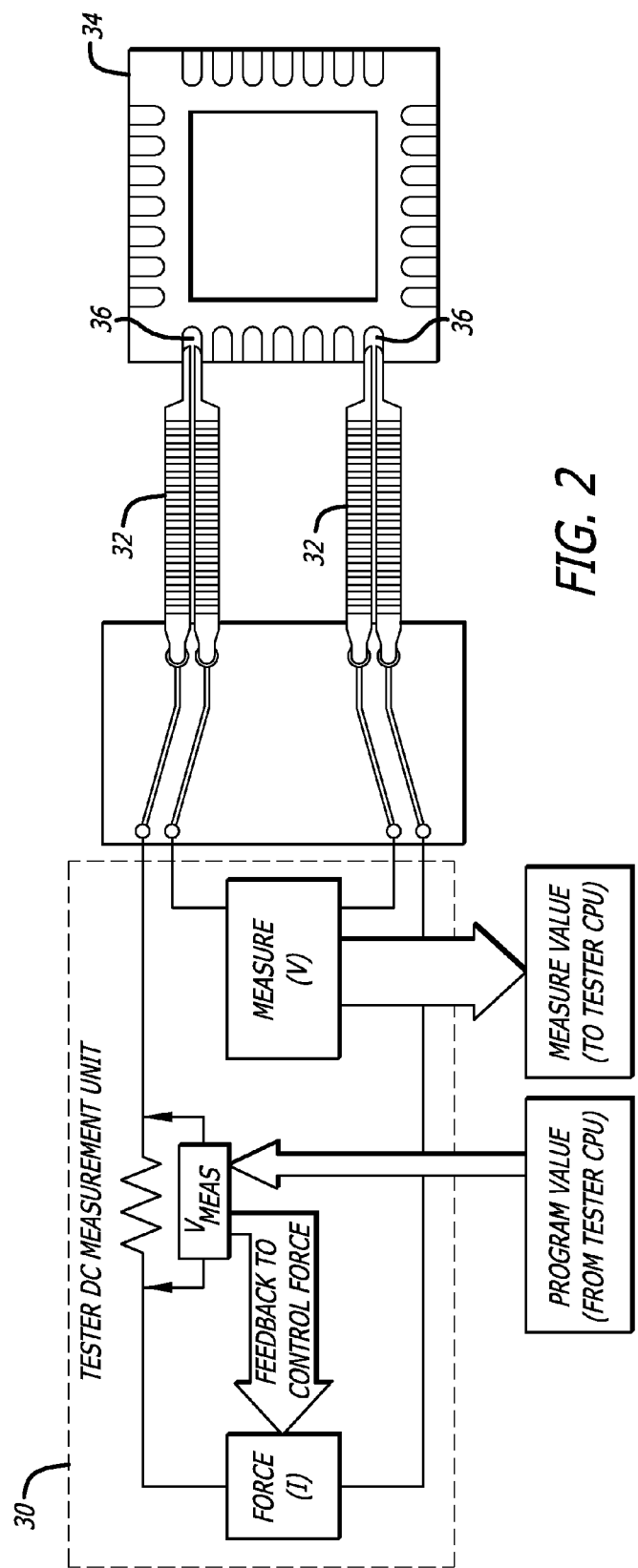
FIG. 2 is a schematic diagram of a Kelvin bridge with Kelvin connectors coupled to a DUT.

FIG. 2 illustrates a measurement set-up using Kelvin connectors 32. A tester CPU sends a programmed force voltage to a DC measurement unit 30, and the voltage $V_{MEAS}$ is received from the program value from the tester CPU. The value of $V_{MEAS}$ is incorporated into a feedback loop to control the delivered force so that the program value is observed. Current is measured as a voltage drop across the DC measurement unit, and this value is delivered to the CPU tester. The Kelvin connectors 32 are connected to the socket 34 which seats the chip to be tested. Special connectors 36 are provided to couple the Kelvin connectors 32 to the DC measurement unit 30. This set-up provides electrically isolated mechanically independent measurement of the device under test, and provides an accurate voltage measurement at any current flow. Unlike other systems where RC of the force path varies slightly with each insertion, in this set-up the RC of the force path has been eliminated. Moreover, the resistance of the sense path is considered insignificant because of the miniscule current flow on the path. On occasion, an isolation resistor may be added to the path such that the stub on the high speed path is reduced and 10 KΩ looks like "open" in a 50Ω environment, and a "short" to the measurement unit.

Kelvin connectors improve the accuracy and efficiency of the measurements when low resistance is present, particularly when the values are below one Ohm. Also when high accuracy voltage force or measurement are used, such as analog to digital or digital to analog converters with small voltage increments. Voltage measurements under high current loading also will benefit from the use of the Kelvin connectors. Kelvin connectors may initially be more expensive than non-Kelvin connectors, due to the need for more probes (and perhaps more expensive probes) in contactor and a more difficult board layout—more traces, finer pitches. Their use may also require more tester resources, potentially extending test time. However, non-Kelvin connectors can often be much more expensive than Kelvin connectors in high-volume production. Frequent probe cleaning is needed to keep test yield up (reportedly as few as a few thousand insertions), and non-Kelvin connectors can significantly cut test cell efficiency (down for cleaning) when it could be running. Frequent probe replacements are needed to keep test yield up, reportedly as few as a few tens of thousands of insertions.

Figure 3:
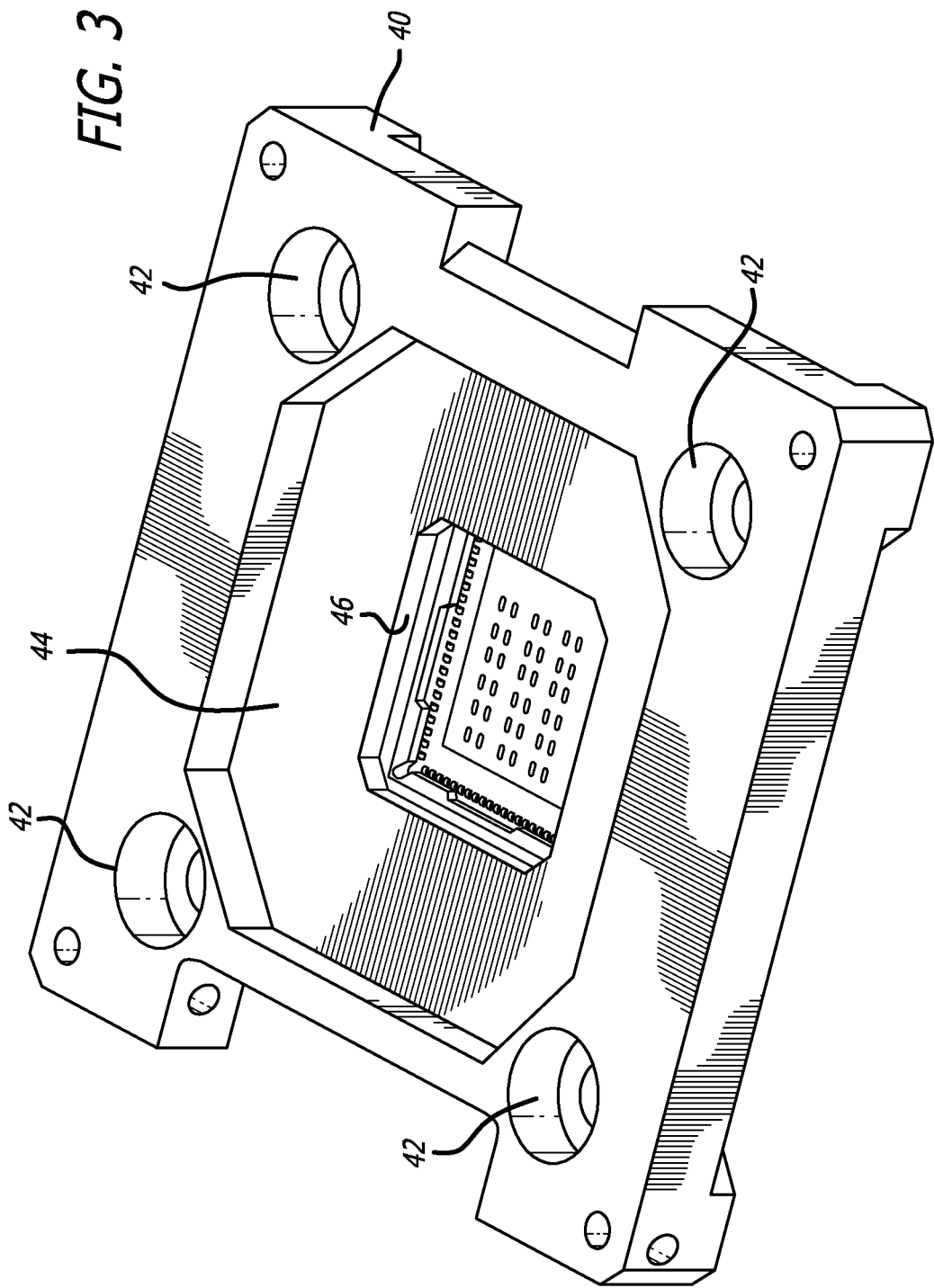
FIG. 3 is an elevated, perspective view of an embodiment of the test socket.

FIG. 3 illustrates an integrated circuit test socket 40 of the type generally described in U.S. Pat. No. 7,918,669, the contents of which are incorporated herein. The details of the test socket is omitted herein for brevity. The test socket 40 has a generally square profile with four aligning holes 42 to mount the test socket on the testing equipment. On a platform 44 of the test socket 40, a square recess 46 is formed to receive the integrated circuit chip (not shown) under test. A plurality of electrical connectors are formed within the recess 46 as described more fully in the '669 patent referenced above. Once the chip is placed in the recess 46, the test socket 40 may be placed, for example, in a handler work press and clamped in the handler in anticipation of testing the integrated chip. Other arrangements, both automated and manual, are also possible with the present invention.

Figure 4:
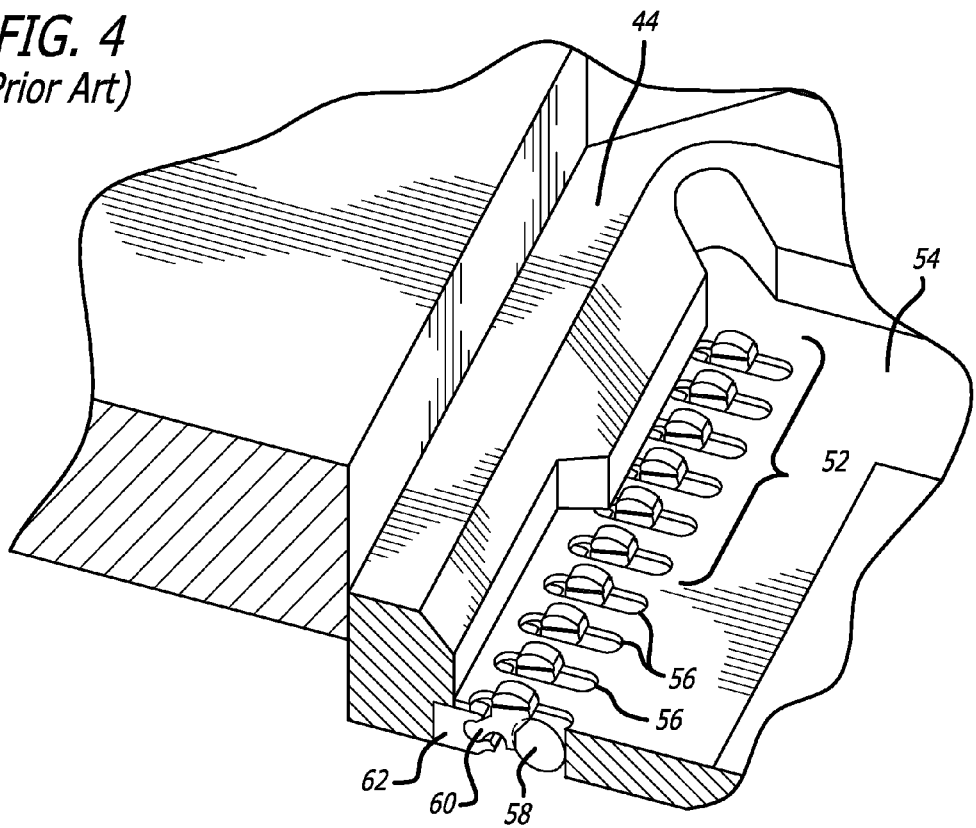
FIG. 4 is an elevated, perspective view, partially cut away, of the prior art connector system.

FIG. 4 illustrates the electrical connectors that cooperate with the test socket to make the contacts needed to test the DUT. The test socket 40 sits on a pad (not shown) as part of the test equipment that can receive electrical signals from the IC and assess the quality, strength, and other characteristics of the signal. The purpose of the test socket 40 is to electrically pass signals from the contact pad of the chip to the test equipment below via a connector assembly 52. The connector assembly 52 pivots between a stand-by or disengaged position where no IC is present (as shown in FIG. 4), and an engaged position, where the engaged position corresponds to the completed electrical circuit between the IC and the test equipment through the connector assembly 52. The base 54 of the socket 40 has a plurality of slots 56 that allow a portion of the connector 52 to emerge from an upper surface. As explained in more detail in U.S. Pat. No. 7,918,669, when the IC is placed on the base 54, the pads of the IC each contact a portion of connector assembly 52 protruding through the slots 56, and cause the connector assembly 52 to pivot into the engaged position. In this way, the electrical contact is established reliably and automatically when the IC is placed on the test socket base 54.

The connector assembly 52 that establishes an electrical connection is a two piece assembly having a link member 60 and a mount element 62. A resilient tubular member 58 is housed in the base 54, and serves to bias the connector assembly 52 in the disengaged position. The mount 62 is retained in the base 54 and includes a generally planar upper surface and a generally planar lower surface. In a preferred embodiment, the base 54 is sized to compress the mount 62 slightly so that it extends into and slightly embeds the test equipment contact surface below. Between the lower and upper surfaces is a laterally opening cavity having a slightly upwardly tilted orientation. The cavity is substantially circular up to a mouth, which then gradually widens toward the link 60, and the cavity is approximately sized to retain a portion of the link member therein. The upper edge of the mouth transitions to the upper surface through a curved finger-like projection. Similarly, the lower edge of the mouth transitions to the lower surface through a projecting lip member. The lip member has a lower edge that curves upward to a front edge.

When the IC is brought to bear against the base 54, the lower surface of the IC contacts the protruding arcuate surface of the link 60 and pushes the link down against the bias of the resilient tubular member 58. This downward force brought to bear by the IC rotates the link counterclockwise against the bias of the resilient member 58, as the link 60 pivots about the mount via the rocker arm. This rotation of the link 60 continues until the leg member makes solid contact with the test equipment below. Further downward force only increases the pressure applied by the rocker arm at the cavity of the mount 62 to bolster the reliability of the contact. This is the engaged position, as there is a direct flow path between the contact pad of the IC, through the arcuate contact surface of the link 60 and through the rocker arm to the mount 62, which is embedded on and affixed to a lead (not shown) of the load board/test equipment. The flow path being established, signals can then be processed by the test equipment from the IC in the conventional manner.

Figure 5:
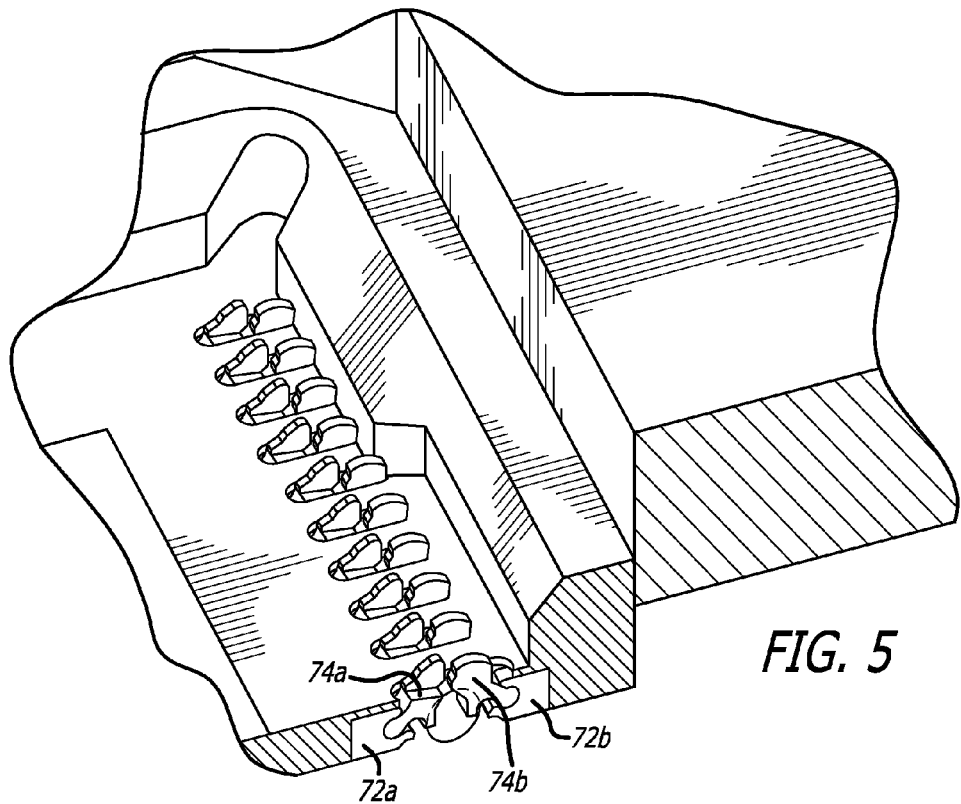
FIG. 5 is an elevated, perspective view, partially cut away, of the present invention's connector system.

In FIG. 5, the single connector assembly 62 has been replaced with a pair of mounts 72a,b with the resilient tubular member 58 located between the pair of mounts 72a,b. Each mount 72a,b is connected to separate board pads below the socket 40 so that each mount carries a separate signal. A first mount 72a carries the "force" signal and the second mount 72b carries the "sense" signal, as discussed above with respect to FIG. 2. The force mount 72a cooperates with a force link 74a and the sense mount 72b cooperates with a sense link 74b. In operation, a force signal is introduced to the signal pad from one side, via the force link 74a, and the opposing sense link 74b receives the device conditioned signal on a separate pad. This enables the measurement of the actual resistance of the device under test as explained above.

Figure 6:
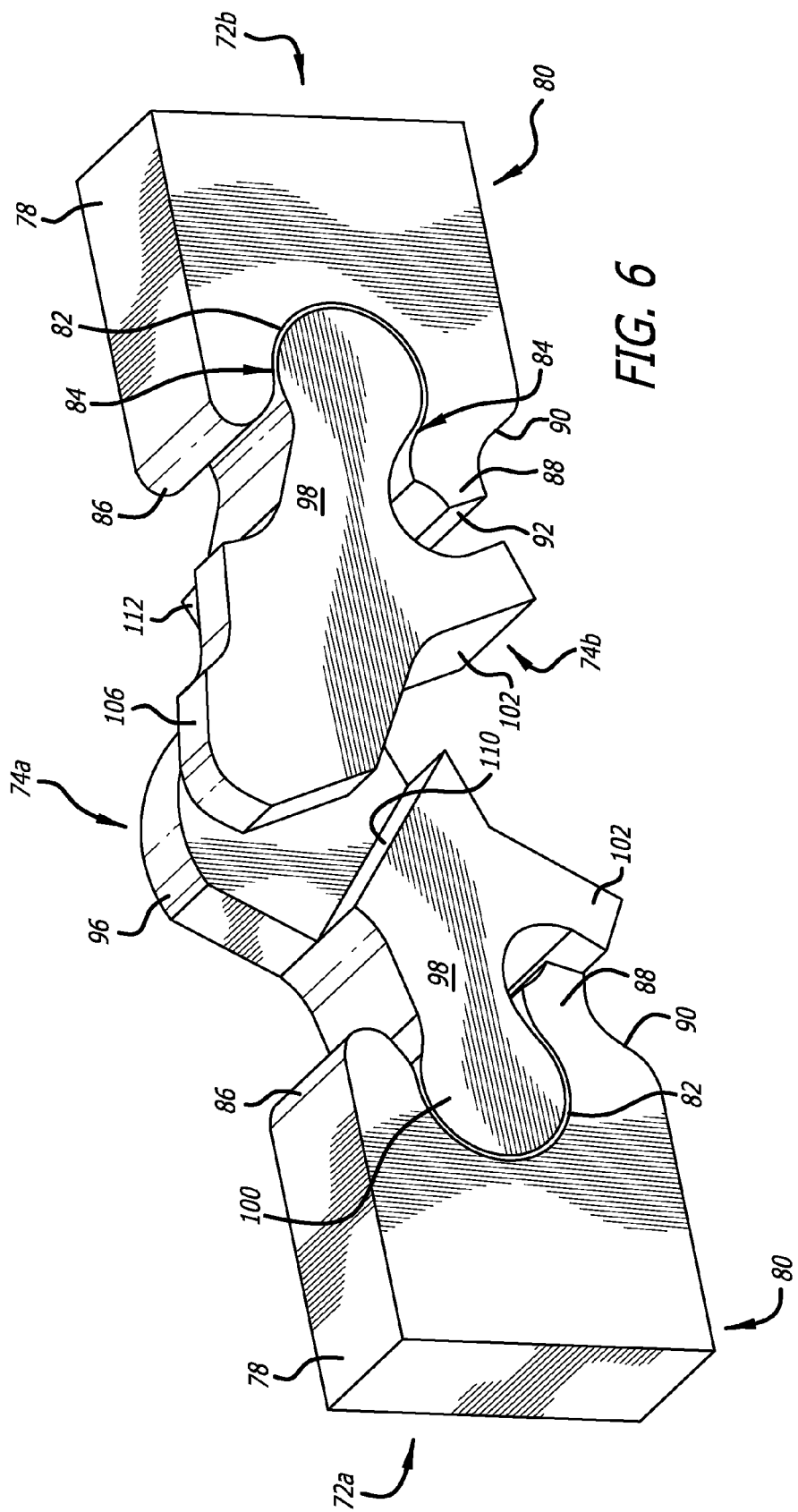
FIG. 6 is an enlarged, elevated perspective view of the nested force and sense links of FIG. 5.

FIG. 6 illustrates the pair of mounts 72a,b and links 74a,b with the resilient member 58 removed for clarity. Each mount 72 includes a generally planar upper surface 78 and a generally planar lower surface 80. Between the lower and upper surfaces is a laterally opening cavity 82 having a slightly upwardly tilted orientation. The cavity 82 is substantially circular up to a mouth 84, which then gradually widens toward the link 74, and the cavity 82 is approximately sized to retain a portion of the link 74 therein. The upper edge of the mouth transitions to the upper surface 78 through a curved finger-like projection 86. Similarly, the lower edge of the mouth transitions to the lower surface 80 through a projecting lip member 88. The lip member 88 has a lower edge 90 that curves upward to a front edge 92.

Figure 7:
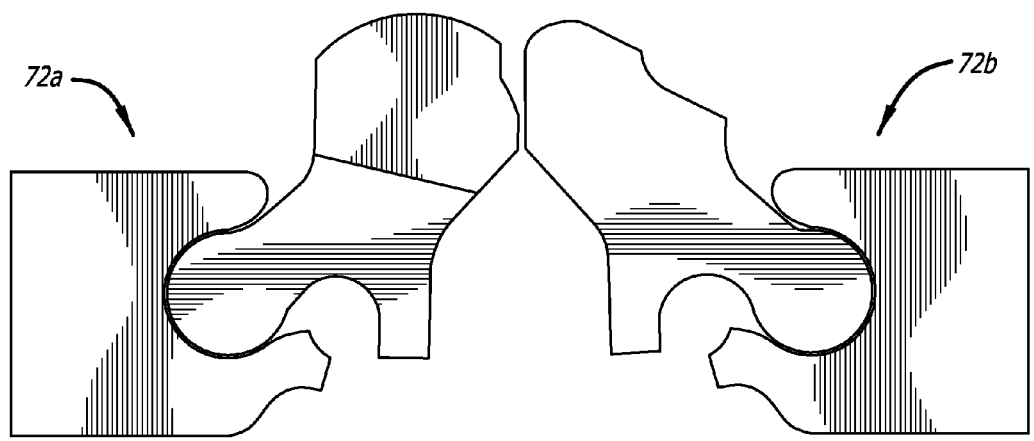
FIG. 7 is a side view of the nested force and sense links prior to contact with the chip.
Figure 8:
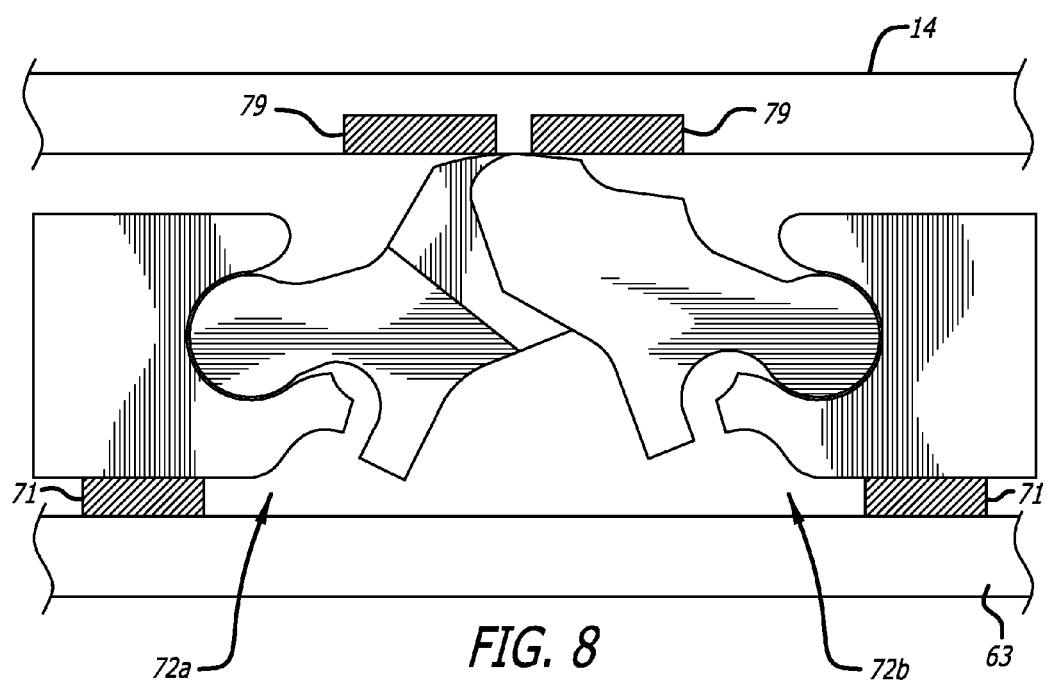
FIG. 8 is a side view of the nested force and sense links of FIG. 7 after contact with the chip.
Figure 9:
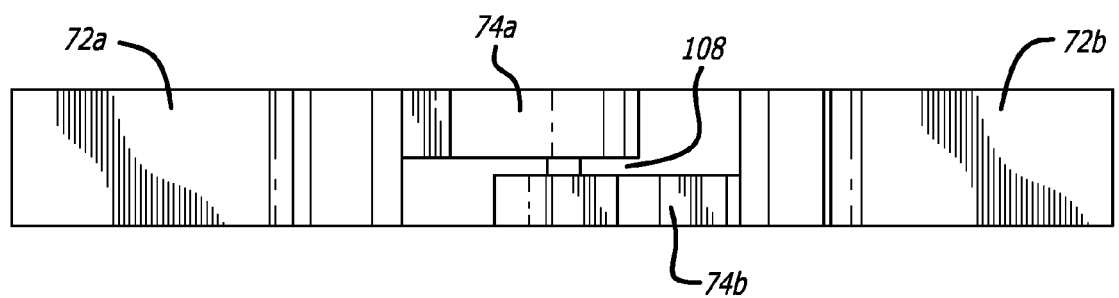
FIG. 9 is a top view of the force and sense links.

The force link 74a has three main components. The first component is an arcuate contact surface 96 along the upper edge that is shaped to permit rolling contact with the IC above as the IC applies a downward force on the link 74a, causing the link 74a to pivot about the mount 72a. The second component of the link 74a is a rocker arm 98 having a neck portion that terminates in a bulb-shaped distal tip 100. The cavity 82 of the mount 72a and the bulb-shaped distal tip 100 of the rocker arm 98 are complimentary sized to allow smoothing pivoting of the rocker arm within the cavity of the mount in a controlled manner without undue wobble. The third component of the link 74a is a heel 102 that counterbalances the upper portion of the mount. When no chip is present, as shown in FIG. 7, the resilient member rotates the mounts up an apart from each other. This is the disengaged or stand-by position as the connection assembly is ready for the presence of the IC chip. When a chip 14 is placed on the connector assembly, the links 74a, 74b rotate toward each other as shown in FIG. 8, and contact is made between the chip's electrical contacts 79 and the links 74, which completes a circuit with the mount 74, contact pads 71, and the testing device 63 to relay the signals from the chip to the testing device. The force link 74a includes a side notch 110 so as to avoid the sense link 74b, and the sense link 74b includes a side notch 112 to avoid the force link 74a. As shown in FIGS. 7-9, when the two links 74a,b rotate, at no point do they make contact with each other due to the notches 110,112 and a horizontal gap 108 that exists between the links 74a,b, which as seen in FIG. 2 is necessary to use the Kelvin connectors. The present invention allows the socket 40 to conduct Kelvin measurements without adding any new real estate to the testing device, and improves the accuracy of the measurements. The links 74a,b can made via EDM, extrusion, machine, etch, 3D metal Printing and/or stamping.

It will be understood that this disclosure is merely illustrative, and that it is to be further understood that changes may be made in the details, particularly in matters of shape, size, material, and arrangement of parts without exceeding the scope of the invention. Accordingly, the scope of the invention is as defined in the language of the appended claims, and is not limited in any manner by the aforementioned descriptions and drawings.

We claim:

1. A socket for electrically coupling an integrated circuit (IC) to a board so that a signal may be transmitted thereto, comprising:
   a base for receiving the integrated circuit thereon;
   an elongate resilient tubular member housed in the base;
   a plurality of force mounts disposed on one side of the elongate resilient tubular member for conducting force signals to a test device below, each force mount including a lateral opening cavity;
   a plurality of sense mounts disposed on an opposite side of the elongate tubular member for conducing sense signals to a test device below, each sense mount including a lateral opening cavity aligned opposite a respective force mount lateral opening cavity;
   a force link cooperating with each force mount to make contact with the integrated circuit, the force link including a rocker arm disposed in the lateral opening cavity of the force mount such that the force link pivots about the force mount at the rocker arm and the lateral opening coupling, each force link biased in a disengaged position by the elongate resilient tubular member;
   a sense link cooperating with each sense mount to make contact with the integrated circuit, the sense link including a rocker arm disposed in the lateral opening cavity of the sense mount such that the sense link pivots about the sense mount at the rocker arm and the lateral opening coupling, each sense link biased in a disengaged position by the elongate resilient member;
   wherein a downward force on the force link rotates the force link toward the sense mount, and the downward force on the sense link rotates the sense link toward the force mount, and wherein a spacing between the force link and the sense link is maintained at all times so that there is no contact between a force link and a sense link.

2. The socket for electrically coupling an integrated circuit of claim 1, further comprising a Kelvin connector connected to the force mount and the sense mount.

3. The socket for electrically coupling an integrated circuit of claim 2, wherein the Kelvin connector communicates the actual resistance of the integrated circuit.

4. The socket for electrically coupling an integrated circuit of claim 1, wherein the force link includes a side notch to avoid the sense link.

5. The socket for electrically coupling an integrated circuit of claim 1, wherein the sense link includes a side notch to avoid the force link.

* * * * *